(12) United States Patent
Lu

(10) Patent No.: US 11,682,650 B2
(45) Date of Patent: Jun. 20, 2023

(54) HEAT ASSISTED FLIP CHIP BONDING APPARATUS

(71) Applicant: National Pingtung University of Science and Technology, Pingtung County (TW)

(72) Inventor: Wei-Hua Lu, Pingtung County (TW)

(73) Assignee: National Pingtung University of Science and Technology, Pingtung County (TW)

( * ) Notice: Subject to any disclaimer, the term of this patent is extended or adjusted under 35 U.S.C. 154(b) by 13 days.

(21) Appl. No.: 17/533,234

(22) Filed: Nov. 23, 2021

(65) Prior Publication Data

US 2022/0384383 A1 Dec. 1, 2022

(30) Foreign Application Priority Data

Jun. 1, 2021 (TW) ................................ 110119900

(51) Int. Cl.
*B23K 3/00* (2006.01)
*B23K 1/00* (2006.01)
(Continued)

(52) U.S. Cl.
CPC .............. *H01L 24/75* (2013.01); *B23K 1/005* (2013.01); *B23K 1/0016* (2013.01); *B23K 3/04* (2013.01);
(Continued)

(58) Field of Classification Search
CPC .......... H01L 24/75; H01L 2224/75252; H01L 2224/75253; H01L 2224/75263;
(Continued)

(56) References Cited

U.S. PATENT DOCUMENTS 3,926,360 A * 12/1975 Moister, Jr. ............ H01R 12/62
228/248.1
9,018,661 B2 * 4/2015 Pindl ....................... H01L 33/56
257/98
(Continued)

FOREIGN PATENT DOCUMENTS

CN 103765865 A * 4/2014 ....... H01L 27/14618
CN 205564742 U * 9/2016
(Continued)

OTHER PUBLICATIONS

Taiwanese Office Action dated Mar. 9, 2023 for Taiwanese Patent Application No. 110119900, 3 pages.

*Primary Examiner* — Kiley S Stoner
(74) *Attorney, Agent, or Firm* — Demian K. Jackson; Jackson IPG PLLC

(57) ABSTRACT

A heat assisted flip chip bonding apparatus includes a semiconductor assembly having a substrate and a chip, a heating source and a press and cover assembly having a cover element and press elements. The chip is disposed above the substrate and includes conductors which contact with conductive pads on the substrate. The heating source is provided to emit a heated light which illuminates the chip via an opening of the cover element. The press elements are located between the cover element and the semiconductor assembly and each includes an elastic unit and a pressing unit. Both ends of the elastic unit are connected to the cover element and the pressing unit respectively, and the pressing unit is provided to press a back surface of the chip.

14 Claims, 2 Drawing Sheets

(51) Int. Cl.
  *H01L 23/00* (2006.01)
  *B23K 1/005* (2006.01)
  *B23K 3/08* (2006.01)
  *B23K 3/04* (2006.01)
  *B23K 101/40* (2006.01)
(52) U.S. Cl.
  CPC ............ *B23K 3/08* (2013.01); *B23K 2101/40* (2018.08); *H01L 2224/759* (2013.01); *H01L 2224/7555* (2013.01); *H01L 2224/7598* (2013.01); *H01L 2224/75252* (2013.01); *H01L 2224/75253* (2013.01); *H01L 2224/75263* (2013.01); *H01L 2224/75283* (2013.01)
(58) Field of Classification Search
  CPC ... H01L 2224/75283; H01L 2224/7555; H01L 2224/759; H01L 2224/7598; H01L 24/13; H01L 24/16; H01L 24/81; H01L 24/95; H01L 2224/16227; H01L 2224/75305; H01L 2224/7531; H01L 2224/75705; H01L 2224/81224; H01L 2224/8123; H01L 2224/81815; H01L 2224/95; B23K 1/0016; B23K 1/005; B23K 3/04; B23K 3/08; B23K 2101/40

USPC .......... 228/44.7, 106, 5.5, 6.2, 179.1–180.22
See application file for complete search history.

(56) References Cited

U.S. PATENT DOCUMENTS

| | | | | |
|---|---|---|---|---|
| 2012/0025218 | A1* | 2/2012 | Ito | H01L 33/505 257/E33.061 |
| 2019/0067539 | A1* | 2/2019 | Kwak | H01L 33/36 |

FOREIGN PATENT DOCUMENTS

| | | | | | |
|---|---|---|---|---|---|
| CN | 106793546 | A | * | 5/2017 | |
| CN | 110238570 | A | * | 9/2019 | |
| CN | 114256106 | A | * | 3/2022 | |
| JP | H05299471 | A | * | 11/1993 | |
| JP | H07131147 | A | * | 5/1995 | |
| JP | 2004014698 | A | * | 1/2004 | ............ H01L 24/75 |
| JP | 2004040050 | A | * | 2/2004 | ............ H01L 24/27 |
| JP | 2005294792 | A | * | 10/2005 | |
| JP | 2012074660 | A | * | 4/2012 | |
| KR | 20100072035 | A | * | 6/2010 | |
| TW | 201537704 | A | | 10/2015 | |
| TW | 202107592 | A | | 2/2021 | |
| TW | 202120235 | A | * | 6/2021 | ............ B23K 1/0056 |
| WO | WO-2010050209 | A1 | * | 5/2010 | ............ H01L 24/75 |

\* cited by examiner

HEAT ASSISTED FLIP CHIP BONDING APPARATUS

FIELD OF THE INVENTION

This invention relates to a flip chip binding apparatus, and more particularly to a heat assisted flip chip bonding apparatus.

BACKGROUND OF THE INVENTION

In flip chip bonding, conductive pads are formed on a substrate and conductive bumps are formed on a chip, then the chip is flipped to align the conductive bumps to the conductive pads one by one, and the conductive bumps are heated to be melted by heat flow for eutectic bond of the conductive bumps and pads. Flip chip bonding technology is widely used owing to it can be applied to manufacture of semiconductor packages having small size, high speed and high density. Benefit from advanced process improvement, thin, small and light-weight chip with multiple layers of lamination is available. However, warpage may be observed as the chip is heated and reflowed because the materials made of the chip have different expansion coefficients, and warpage may cause weaker bonding between the conductive bumps of the chip and the conductive pads of the substrate.

SUMMARY

One object of the present invention is to utilize a press and cover assembly to press a chip while a heating source provides heat for reflow such that conductors on the chip can be bonded to conductive pads on a substrate. At the same time, the press and cover assembly can block partial heated light from the heating source to avoid heat damage of other electronic components on the substrate.

A heat assisted flip chip bonding apparatus of the present invention includes a semiconductor assembly, a heating source and a press and cover assembly. The semiconductor assembly includes a substrate and a chip, the substrate includes a plurality of conductive pads, the chip is disposed above the substrate and includes a plurality of conductors which contact with the conductive pads one be one. The heating source is located above the semiconductor assembly and provided to generate a heated light. The press and cover assembly is located between the semiconductor assembly and the heating source and includes a cover element and a plurality of press elements. The cover element has an opening which shows the chip and allows the chip to be irradiated by the heated light. The press elements are located between the cover element and the semiconductor assembly and each includes an elastic unit and a pressing unit. One end of the elastic unit is connected to the cover element and the other end of the elastic unit is connected to the pressing unit. The pressing unit is provided to press a back surface of the chip.

The press and cover assembly of the present invention can cover and press the semiconductor assembly at the same time during reflow, thereby protecting other electronic components on the substrate from heat damage and ensuring that the substrate and chip of the semiconductor assembly can be bonded with each other reliably.

DETAILED DESCRIPTION OF THE INVENTION

Figure 1:
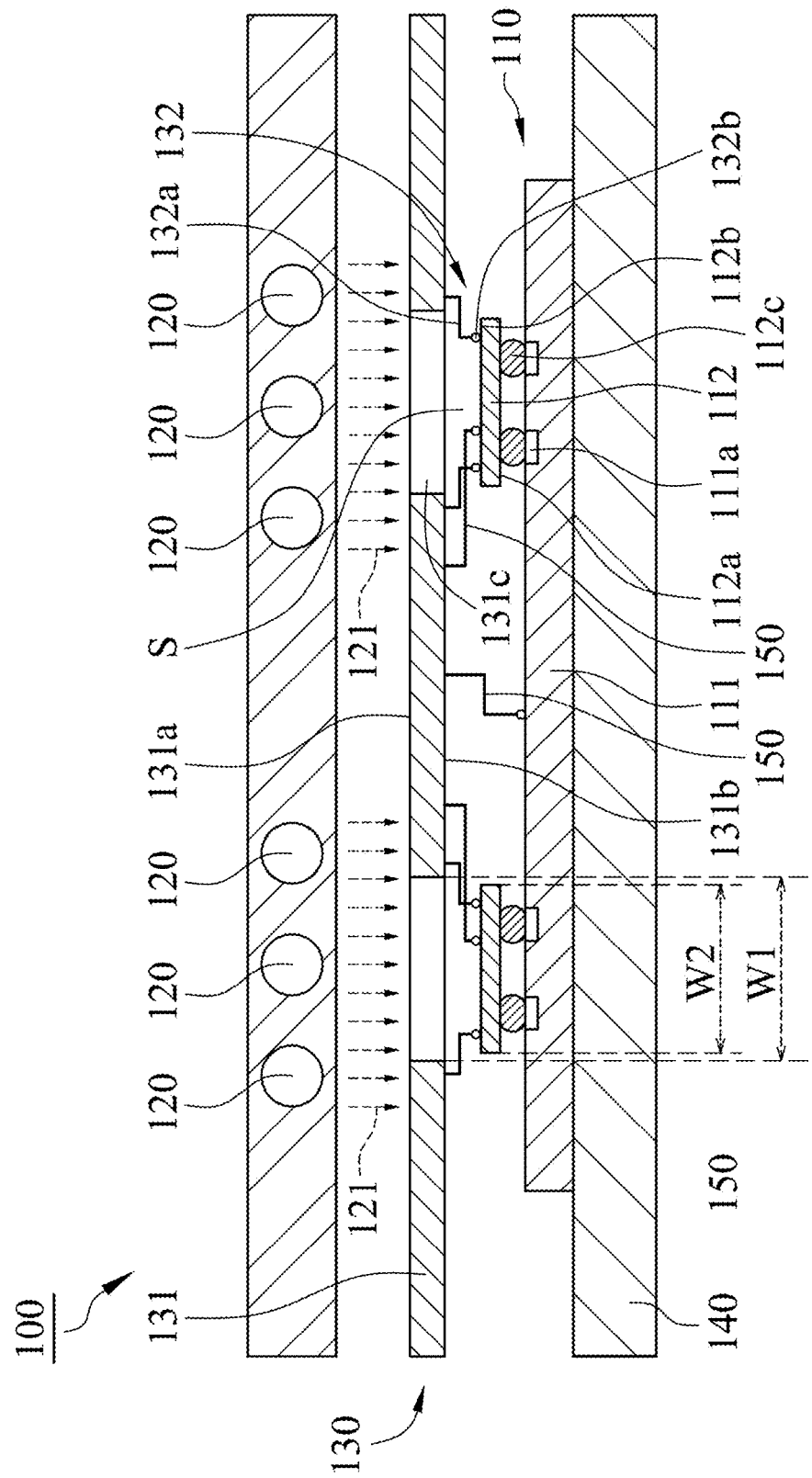
FIG. 1 is a cross-section view diagram illustrating a heat assisted flip chip bonding apparatus in accordance with a first embodiment of the present invention.

With reference to FIG. 1, a heat assisted flip chip bonding apparatus 100 in accordance with a first embodiment of the present invention includes a semiconductor assembly 110, a heating source 120, a press and cover assembly 130, a support base 140 and a plurality of temperature sensors 150. The semiconductor assembly 110 is placed on the support base 140, the press and cover assembly 130 is located between the semiconductor assembly 110 and the heating source 120. A heated light 121 emitted from the heating source 120 is provided to heat and reflow the semiconductor assembly 110. The press and cover assembly 130 is provided to block a part of the heated light 121 emitted from the heating source 120 and press the semiconductor assembly 110 at the same time so as to reduce risk of failed bonding resulting from warpage of the semiconductor assembly 110.

In the first embodiment, the semiconductor assembly 110 includes a substrate 111 and a plurality of chips 112. There are a plurality of conductive pads 111a arranged on the substrate 111. The chips 112 are placed above the substrate 111 and each has a front surface 112a, a back surface 112b and a plurality of conductors 112c, the front surface 112a faces toward the substrate 111, the back surface 112b faces toward the press and cover assembly 130, the conductors 112c are arranged on the front surface 112a of each of the chips 112. The conductors 112c of each of the chips 112 may be solder balls or bumps formed on the front surface 112a of each of the chips 112 before bonding. The conductors 112c contact the conductive pads 111a on the substrate 111 one be one while each of the chips 112 is mounted on the substrate 111 such that the conductors 112c can be bonded to the conductive pads 111a for signal transmission between the chips 112 and the substrate 111.

The heating source 120 is located above the semiconductor assembly 110 and used to emit the heated light 121. The heated light 121 can heat and reflow the semiconductor assembly 110 to allow the conductors 112c of each of the chips 112 to be melted and connected to the conductors 111a of the substrate 111. In this embodiment, the heating source 120 is an infrared source and the heated light 121 is infrared ray. In other embodiments, the heating source 120 may be a laser source.

The press and cover assembly 130 is located between the semiconductor assembly 110 and the heating source 120. In this embodiment, the press and cover assembly 130 includes a cover element 131 and a plurality of press elements 132. The cover element 131 has a top surface 131a, a bottom surface 131b and a plurality of openings 131c, the top surface 131a faces toward the heating source 120, the bottom surface 131b faces toward the chips 112, the openings 131c penetrate through the cover element 131 to connect with the top surface 131a and the bottom surface 131b. The chips 112 are visible through the openings 131c so they can be irradiated by the heated light 121 of the heating source 120 via the openings 131c to be heated and reflowed. Furthermore, other electronic components on the substrate 111 are protected from heat damage owing to the cover element 131 allows only the chips 112 to be irradiated with the heated light 121. Preferably, a width W1 of each of the openings 131c is greater than or equal to a width W2 of each of the chips 112 so as to ensure that the back surface 112b of each of the chips 112 is irradiated with the heated light 121.

The press elements 132 are located between the cover element 131 and the semiconductor assembly 110 and each includes an elastic unit 132a and a pressing unit 132b. One end of the elastic unit 132a is connected to the bottom surface 131b of the cover element 131 and the other end of the elastic element 132a is connected to the pressing unit 132b. The pressing unit 132b can contact the back surface 112b of the chip 112 to press the chip 112 because the width W1 of the opening 131c is not less than the width W2 of the chip and the end of the elastic unit 132a connected to the pressing unit 132b can extend to a space S existing between the opening 131c and the chip 112. The elastic unit 132a is made of a flexible material and provided to elastically press the chip 112 without damage on the chip 112. Preferably, the pressing units 132b are spherical so as to reduce contact area of each of the pressing units 132b and the chip 112 and avoid scratches on the back surface 112b of the chip 112 caused by the pressing units 132b.

In this embodiment, the support base 140 is movable to move the substrate 111 toward the press and cover assembly 130, and the press and cover assembly 130 is stationary to make sure the press elements 132 can press the chips 112 for the connection between the conductors 112c on the chips 112 and the conductive pads 111a on the substrate 111 as the conductors 112c are heated and reflowed by the heated light 121. In other embodiments, the support base 140 is fixed and the press and cover assembly 130 is movable, consequently, the press and cover assembly 130 can be moved toward the semiconductor assembly 110 to allow the press elements 132 to press the chips 112 for the connection between the conductors 112c on the chips 112 and the conductive pads 111a on the substrate 111.

The temperature sensors 150 are used to measure temperatures of the substrate 111 and the chips 112 of the semiconductor assembly 110 such that it is possible to adjust heat output of the heating source 120 to achieve required reflow temperature which allows the conductors 112c of the chips 112 to be totally melted for eutectic bonding of the conductors 112c of the chips 112 and the conductive pads 111a of the substrate 111. Furthermore, heat damage of electronic components on the substrate 111 is preventable by monitoring temperatures of the substrate 111 and the chips 112 so as to further improve product yield. In other embodiments, the temperature sensors 150 are used to sense temperature of the substrate 111 or the chips 112 to monitor reflow temperature for yield improvement of the semiconductor assembly 110. The temperature sensors 150 can be contact or non-contact temperature sensors, the present invention does not limit the type of the temperature sensors 150.

Figure 2:
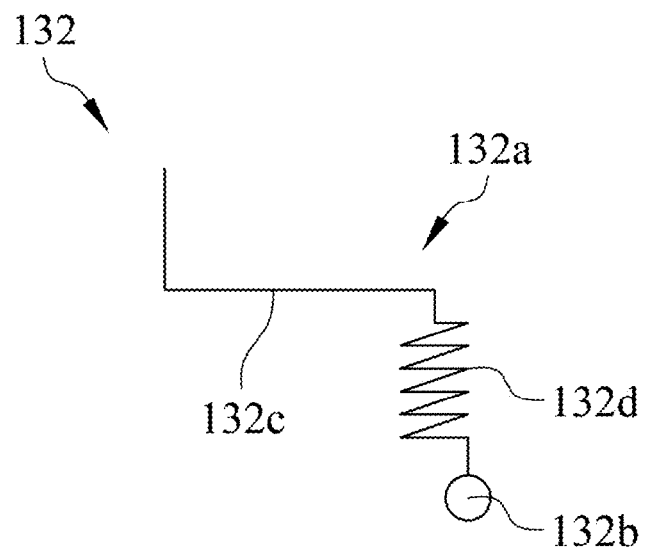
FIG. 2 is a diagram illustrating a press element in accordance with a second embodiment of the present invention.

The press element 132 of a second embodiment as shown in FIG. 2 includes an elastic arm 132c and a spring portion 132d, both ends of the elastic arm 132c are connected to the bottom surface 131b of the cover element 131 and one end of the spring portion 132d respectively, the other end of the spring portion 132d is connected to the pressing unit 132b. In the second embodiment, the spring portion 132d can be modified in diameter of coil wire, number of coils, compression level, material, and so on to generate required press-on force for different semiconductor assemblies 110, thereby allowing more flexibility in use of the press and cover assembly 130.

Figure 3:
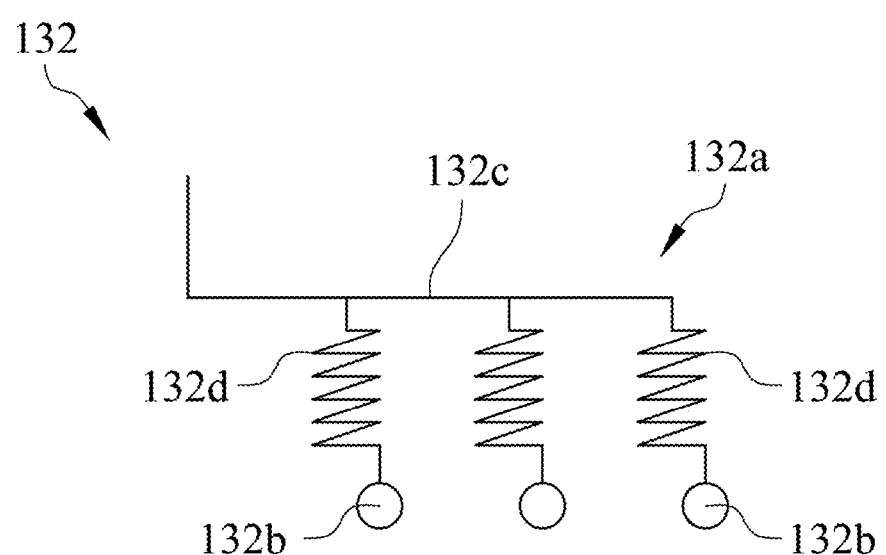
FIG. 3 is a diagram illustrating a press element in accordance with a third embodiment of the present invention.

The press element 132 of a third embodiment is shown in FIG. 3. Different to the press elements 132 of the second embodiment, the press element 132 of the third embodiment includes a plurality of pressing units 132b, the elastic unit 132a of the press element 132 of the third embodiment includes a plurality of spring portions 132d, both ends of the elastic arm 132c are connected to the bottom surface 131b of the cover element 131 and one end of each of the spring portions 132d, and the other end of each of the spring portions 132d is connected to each of the pressing units 132b. The spring portions 132d and the pressing units 132b are provided to increase available pressing area of the press element 132 to apply even pressure on the chip 112 which may have greater size.

In the present invention, the press and cover assembly 130 is provided to cover and press the semiconductor assembly 110 simultaneously during reflow. The press and cover assembly 130 not only protect electronic components on the substrate 111, but also makes sure that the substrate 111 and the chips 112 of the semiconductor assembly 110 can be bonded to each other by reflow heating.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A heat assisted flip chip bonding apparatus comprising:
   a semiconductor assembly including a substrate and a chip, the substrate includes a plurality of conductive pads, the chip is disposed above the substrate and includes a plurality of conductors, each of the plurality of conductors is contacted with each of the plurality of conductive pads of the substrate;
   a heating source located above the semiconductor assembly and configured to generate a heated light; and
   a press and cover assembly located between the semiconductor assembly and the heating source and including a cover element and a plurality of press elements, the cover element includes an opening which is configured to show the chip and allow the chip to be irradiated by the heated light, the plurality of the press elements are located between the cover element and the semiconductor assembly and each includes an elastic unit and a pressing unit, one end of the elastic unit is connected to the cover element and the other end of the elastic unit is connected to the pressing unit, the pressing unit is configured to press a back surface of the chip.

2. The heat assisted flip chip bonding apparatus in accordance with claim 1, wherein a top surface of the cover element faces toward the heating source and a bottom surface of the cover element faces toward the chip, the plurality of press elements are disposed on the bottom surface of the cover element.

3. The heat assisted flip chip bonding apparatus in accordance with claim 2, wherein the elastic unit of each of the plurality of press elements includes an elastic arm and a spring portion, both ends of the elastic arm are connected to the bottom surface of the cover element and one end of the spring portion respectively, the other end of the spring portion is connected to the pressing unit.

4. The heat assisted flip chip bonding apparatus in accordance with claim 2, wherein each of the plurality of press elements includes a plurality of pressing units, and the elastic unit of each of the plurality of press elements includes an elastic arm and a plurality of spring portions, both ends of the elastic arm are connected to the bottom surface of the cover element and one end of each of the plurality of spring portions respectively, the other end of each of the plurality of spring portions is connected to each of the plurality of pressing units.

5. The heat assisted flip chip bonding apparatus in accordance with claim 1, wherein the pressing unit is spherical.

6. The heat assisted flip chip bonding apparatus in accordance with claim 1, wherein the other end of the elastic unit is extended to a space existing between the opening and the chip.

7. The heat assisted flip chip bonding apparatus in accordance with claim 3, wherein the pressing unit is spherical.

8. The heat assisted flip chip bonding apparatus in accordance with claim 3, wherein the other end of the elastic unit is extended to a space existing between the opening and the chip.

9. The heat assisted flip chip bonding apparatus in accordance with claim 4, wherein the plurality of pressing units are spherical.

10. The heat assisted flip chip bonding apparatus in accordance with claim 4, wherein the other end of the elastic units is extended to a space existing between the opening and the chip.

11. The heat assisted flip chip bonding apparatus in accordance with claim 1, wherein a width of the opening is greater than or equal to a width of the chip.

12. The heat assisted flip chip bonding apparatus in accordance with claim 1, wherein the plurality of conductors of the chip are solder balls or bumps.

13. The heat assisted flip chip bonding apparatus in accordance with claim 1 further comprising a support base, wherein the substrate is configured to be disposed on the support base, the support base is movable and configured to move the substrate toward the press and cover assembly to allow the plurality of press elements to press the chip.

14. The heat assisted flip chip bonding apparatus in accordance with claim 1 further comprising a temperature sensor, wherein the temperature sensor is configured to sense a temperature of the substrate or the chip of the semiconductor assembly.

\* \* \* \* \*